(12) United States Patent
Andreev et al.

(10) Patent No.: US 8,046,643 B2
(45) Date of Patent: Oct. 25, 2011

(54) TRANSPORT SUBSYSTEM FOR AN MBIST CHAIN ARCHITECTURE

(75) Inventors: Alexandre Andreev, San Jose, CA (US);
Anatoli Bolotov, Cupertino, CA (US);
Mikhail Grinchuk, San Jose, CA (US)

(73) Assignee: LSI Corporation, Milpitas, CA (US)

(*) Notice: Subject to any disclaimer, the term of this patent is extended or adjusted under 35 U.S.C. 154(b) by 591 days.

(21) Appl. No.: 12/183,512

(22) Filed: Jul. 31, 2008

(65) Prior Publication Data

US 2009/0307543 A1 Dec. 10, 2009

(51) Int. Cl.
*G11C 29/00* (2006.01)
*G01R 31/28* (2006.01)

(52) U.S. Cl. .................. 714/718; 714/726; 714/742

(58) Field of Classification Search .................. 714/718, 714/724, 726, 742
See application file for complete search history.

(56) References Cited

U.S. PATENT DOCUMENTS

| | | | |
|---|---|---|---|
| 4,517,512 A | 5/1985 | Petrich et al. ................ 324/73 R |
| 4,929,889 A | 5/1990 | Seiler et al. .................. 371/22.3 |
| 5,051,997 A | 9/1991 | Sakashita et al. ............ 371/22.4 |
| 5,535,164 A * | 7/1996 | Adams et al. ................. 365/201 |
| 5,742,557 A | 4/1998 | Gibbins et al. ........... 365/230.05 |
| 5,896,330 A | 4/1999 | Gibson ......................... 365/201 |
| 6,014,336 A | 1/2000 | Powell et al. ................. 365/201 |
| 6,070,256 A | 5/2000 | Wu et al. ....................... 714/718 |
| 6,288,969 B1 | 9/2001 | Gibbins et al. ........... 365/230.05 |
| 6,347,056 B1 | 2/2002 | Ledford et al. ................ 365/201 |
| 6,587,979 B1 * | 7/2003 | Kraus et al. .................. 714/720 |
| 6,681,358 B1 | 1/2004 | Karimi et al. ................. 714/733 |
| 6,941,494 B1 | 9/2005 | Andreev et al. .............. 714/718 |
| 7,010,736 B1 | 3/2006 | Teh et al. ...................... 714/733 |
| 7,028,240 B1 | 4/2006 | Bautista, Jr. et al. ......... 714/733 |
| 7,062,694 B2 | 6/2006 | Caty et al. ..................... 714/733 |
| 7,139,204 B1 | 11/2006 | Behera .......................... 365/201 |
| 7,203,873 B1 * | 4/2007 | Adams et al. ................. 714/718 |
| 7,653,854 B2 | 1/2010 | Anzou et al. .................. 714/733 |
| 7,773,439 B2 | 8/2010 | Do et al. ....................... 365/201 |
| 7,814,385 B2 * | 10/2010 | Bahl ............................. 714/733 |
| 2002/0104051 A1 | 8/2002 | Gupta .......................... 714/733 |

(Continued)

OTHER PUBLICATIONS

Huang, D.C.; Jone, W.B.; , "A parallel transparent BIST method for embedded memory arrays by tolerating redundant operations," Computer-Aided Design of Integrated Circuits and Systems, IEEE Transactions on , vol. 21, No. 5, pp. 617-628, May 2002 doi: 10.1109/43.998632 URL: http://ieeexplore.ieee.org/stamp/stamp.jsp?tp=&arnumber=998632&isnumber=21547.*

(Continued)

*Primary Examiner* — Cynthia Britt
(74) *Attorney, Agent, or Firm* — Christopher P. Maiorana, PC

(57) ABSTRACT

An apparatus including a controller configured to present one or more commands and receive one or more responses, a plurality of transport circuits configured to receive one of the commands, present the responses, and generate one or more control signals, and a plurality of memory-controlling circuits, each coupled to a respective one of the plurality of transport circuits and configured to generate one or more memory access signals in response to the one or more control signals, receive one or more memory output signals from a respective memory in response to the one or more memory access signals, and generate the responses in response to the one or more memory output signals. Each respective memory may be independently sized. The controller generally provides a common testing routine for each respective memory that may be adjusted for the size of each respective memory by the memory-controlling circuits.

20 Claims, 5 Drawing Sheets

U.S. PATENT DOCUMENTS

| | | | |
|---|---|---|---|
| 2002/0174394 A1 | 11/2002 | Ledford et al. | 714/733 |
| 2002/0188902 A1 | 12/2002 | Fan et al. | 714/724 |
| 2004/0181303 A1 | 9/2004 | Walmsley | 700/115 |
| 2005/0028058 A1 | 2/2005 | Perner | 714/718 |
| 2005/0138514 A1 | 6/2005 | Burdine et al. | 714/733 |
| 2005/0246602 A1 | 11/2005 | Bahl et al. | 714/733 |
| 2006/0156134 A1 | 7/2006 | Mukherjee et al. | 714/733 |
| 2006/0242521 A1 | 10/2006 | Hii et al. | 714/733 |
| 2007/0220389 A1 | 9/2007 | Sato | 714/733 |
| 2008/0077834 A1 | 3/2008 | Khoche et al. | 714/732 |
| 2008/0126892 A1 | 5/2008 | Dubey et al. | 714/718 |
| 2008/0282119 A1 | 11/2008 | Suzuki et al. | 714/718 |

OTHER PUBLICATIONS

Li-Ming Denq, Rei-Fu Huang, Cheng-Wen Wu, Yeong-Jar Chang, Wen-Ching Wu, "A Parallel Built-in Diagnostic Scheme for Multiple Embedded Memories," mtdt, pp. 65-69, Records of the 2004 International Workshop on Memory Technology, Design and Testing (MTDT'04), 2004.*

* cited by examiner

TRANSPORT SUBSYSTEM FOR AN MBIST CHAIN ARCHITECTURE

FIELD OF THE INVENTION

The present invention relates to memory architectures generally and, more particularly, to a method and/or apparatus for implementing a transport subsystem for an MBIST chain architecture.

BACKGROUND OF THE INVENTION

Testing of VSLI designs becomes more common with the growth of the complexity of such designs. Testing should be very accurate to reduce the number of non-detected faults. Testing should also be fast and inexpensive in terms of hardware and software overhead. An especially important task is the testing of memories. To reduce the size of a memory, gates and wires are typically placed very densely on a semiconductor wafer. Dense placement often results in a significantly higher ratio of faults (i.e., up to 4 times higher) in these areas. Fortunately, memories are very regular structures, so testing can be done on-chip, based on data sequences generated by relatively small processors. Such a processor can, for example, produce necessary data and address sequences (like well-known march test sequences), check the output signals of the memory and produce error reports and/or reconfiguration information to be used in self-repair mode.

If a design contains a single memory, the above-described solution works well. The controller is typically small enough (if compared with memory size), and can be placed near memory I/O ports (i.e., interconnection wiring and timing issues are not critical). However, if a number of memories are implemented on the same chip, and the memories have different sizes and configurations, testing becomes more complicated. Individual controllers can be implemented for each memory—but will potentially require a large overhead in gate count. Also, one controller could possibly be used for multiple memories—but at the expense of being very accurate in the synchronization of such an engine, and in the complexity of data interchange between controller and memories.

It would be desirable to implement a system and/or method with low gate complexity, moderate wiring and high flexibility that may uniformly interconnect memories of different sizes and types without limitations on the mutual placement of memories under test.

SUMMARY OF THE INVENTION

The present invention concerns an apparatus comprising a controller, a plurality of transport circuits and a plurality of memory-controlling circuits. The controller may be configured to (i) present one or more commands and (ii) receive one or more responses. Each of the plurality of transport circuits may be configured to (i) receive one of the commands, (ii) present the responses, and (iii) generate one or more control signals. Each of the plurality of memory-controlling circuits may be (i) coupled to a respective one of the plurality of transport circuits and (ii) configured to (i) generate one or more memory access signals in response to the one or more control signals, (ii) receive one or more memory output signals from a respective memory in response to the one or more memory access signals and (iii) generate the responses in response to the one or more memory output signals. Each respective memory may be independently sized. The controller generally provides a common testing routine for each respective memory that may be adjusted for the size of each respective memory by the memory-controlling circuits.

The objects, features and advantages of the present invention include providing a transport subsystem for a memory built-in self test (MBIST) chain architecture that may (i) provide a single test controller, (ii) operate with a variety of sizes and configurations of memory circuits, (iii) minimize testing overhead and/or (iv) minimize area used by gates and wires implementing a test architecture.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide a system for the interconnection between a controller, such as a Built-In Self-Test (BIST) controller, and one or more memories via custom designed memory collars. In one example, the interconnection system in accordance with the present invention may be referred to as a transport subsystem (of a MBIST architecture). The present invention may allow individual memory circuits, or subsets of memory circuits, to be tested and/or operated using a common controller.

Figure 1:
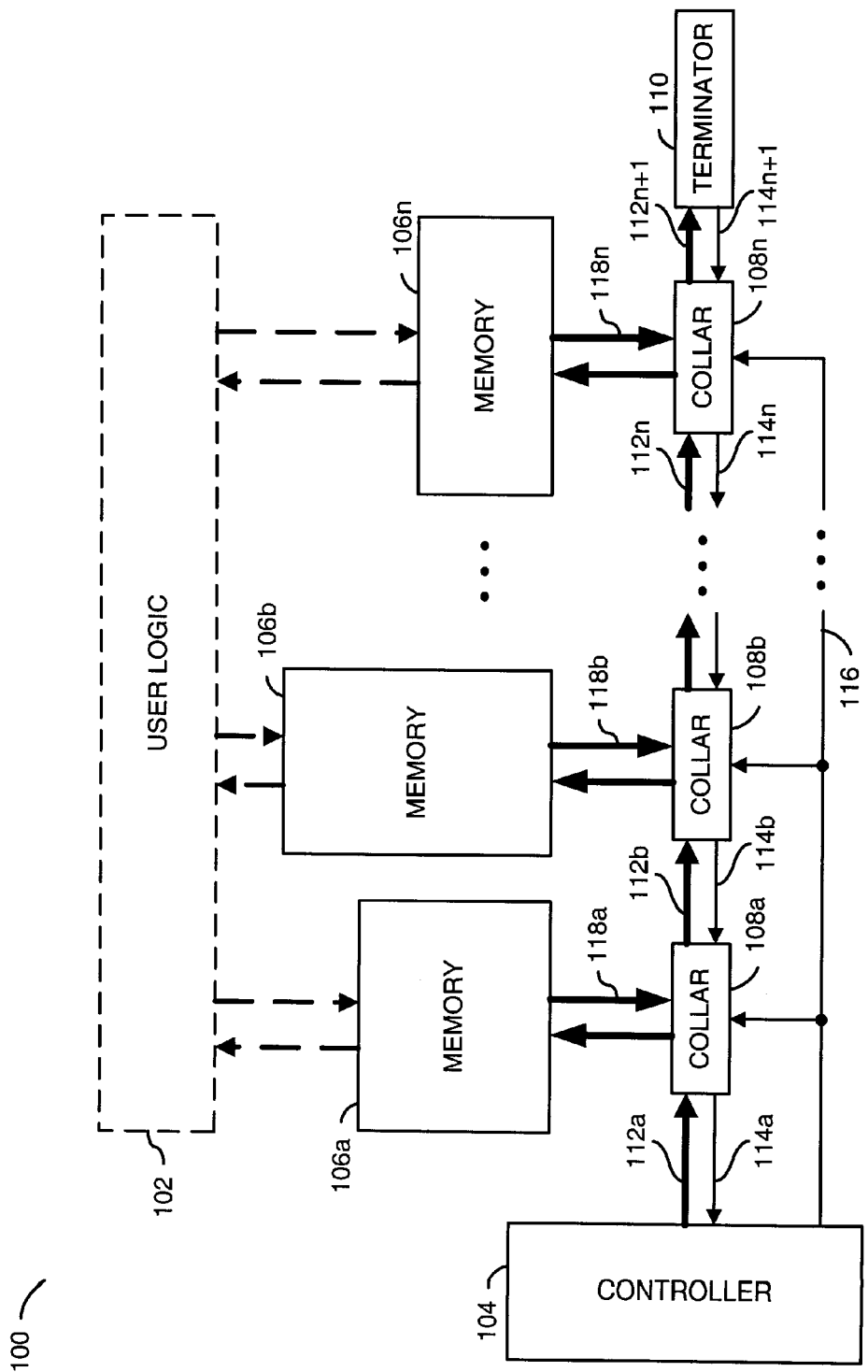
FIG. 1 is a block diagram generally illustrating a memory BIST system including a transport subsystem in accordance with the present invention.

Referring to FIG. 1, a block diagram is shown illustrating an MBIST system 100 including a transport subsystem in accordance with a preferred embodiment of the present invention. The system 100 generally comprises a block (or circuit) 102, a block (or circuit) 104, a number of blocks (or circuits) 106a-106n, a number of blocks (or circuits) 108a-108n and a block (or circuit) 110. In one example, the circuit 102 generally represents a user logic circuit. The circuit 104 generally represents a controller circuit. The circuits 106a-106n generally represents memory circuits. The circuits 108a-108n generally represent memory collar circuits. The circuit 110 generally represents a terminator circuit. In one example, the controller circuit 104 may be implemented as a BIST circuit. The controller circuit 104 may be a common controller used with each of the memory circuits 106a-106n.

The memory circuits 106a-106n may be placed on the same integrated circuit as, or on separate integrated circuits from, the memory collar circuits 108a-108n. For example, the memory circuits 106a-106n may be instantiated on an integrated circuit along with the memory collar circuits 108a-108n. Alternately, sockets (not shown) may be implemented between the memory circuits 106a-106n and the memory collar circuits 108a-108n. With sockets, a number of different memory circuits 106a-106n may be connected to each of the memory collar circuits 108a-108n.

The system 100 may be referred to as a memory built-in self-test (MBIST) chain architecture, because the memory circuits 106a-106n may be coupled to form a chain. A number of busses 112a-112n, a number of busses 114a-114n and a bus 116 may be implemented coupling the controller 104 and the memory collar circuits 108a-108n. The busses 112a-112n may be implemented, in one example, having a moderate width (e.g., 8-10 bits). The busses 114a-114n and the bus 116 may be implemented, in one example, as single-bit busses. However, other bit-widths may also be implemented. The busses 112a-112n and 114a-114n may couple the memory collar circuits 108a-108n to form a pipelined chain. The controller 104 may be connected to one end of the chain via the busses 112a, 114a and 116. The terminator circuit 110 may be coupled to another end of the chain via a bus 112n+1 and a bus 114n+1. The busses 112n+1 and 114n+1 may be configured similarly to the busses 112a-112n and 114a-114n, respectively.

Each of the memory collar circuits 108a-108n may be configured to operate with a particular one of the memory circuits 106a-106n. The memory collar circuits 108a-108n may be implemented to allow the various memory circuits 106a-106n to operate with the common controller 104. For example, the collar 108a may operate with the memory 106a, the collar 108b may operate with the memory 106b, etc. The structures and/or size of the memories 106a-106n may be varied to meet the design criteria of a particular implementation. For example, a customer may specify a 4-port memory having 1024 words×128 bits, plus a 1-port memory having 1M words×16 bits, plus a 3-port memory having 16K×36 bits with two ports for reading and 1 port for writing, etc.

When the memories have been specified, an engineer (or designer) may prepare the controller 104 and the collars 108a-108n to support adequate testing protocols. The engineer may run a process (e.g., using computer aided design, or CAD software) to design a part of a netlist (e.g., text in Verilog or other hardware description language) corresponding to the controller 104 and collars 108a-108n. The netlist may be incorporated into the customer's design. With the netlist incorporated in to the design, the design may be transformed by multiple tools and become a set of photo masks for chip fabrication. The present invention allows the addition of test capability without altering the memories 106a-106n and/or the user logic 102.

The present invention may provide custom generation of the collars 108a-108n and the controller 104 to test the customer specified memories. In general, the parameters of the memory circuits 106a-106n are known in advance. The length of particular busses 112a-112n and 114a-114n connecting the neighboring collars 108a-108n (or to the controller 104 and the nearest one of the collars 108a-108n) is not generally a critical parameter and may be varied. For example, the system 100 may be implemented on a single integrated circuit chip, on multiple separate integrated circuit chips, or with fully non-integrated elements (e.g., vacuum tubes, electromagnetic switches, etc.). The MBIST chain architecture generally permits splitting long connections into smaller pieces by adding flip-flop boundaries between the connections.

The bus 116 may be implemented, in one example, as a 1-bit bus. A set of 1-bit mode selection signals (e.g., TEST/USER MODE SELECTION) may be sent to each of the memory collar circuits 108a-108n via the bus 116. For example, a first value (e.g., 0) may indicate a user mode and a second value (e.g., 1) may indicate a test mode. In the user mode, the collars 108a-108n may be "switched off" and the connections between the memories 106a-106n and the user logic 102 may be enabled. In the test mode, the connections between the memories 106a-106n and the user logic 102 may be disabled, and the connections between the memories 106a-106n and the memory collar circuits 108a-108n may be enabled. The memory collar circuits 108a-108n may send read/write commands, addresses and data to the memories 106a-106n through a number of busses 118a-118n. The busses 118a-118n may be implemented, for example, as bi-directional busses, a set of uni-directional busses, or a combination of bi-directional and uni-directional busses. The collars 108a-108n may also receive values that may be output by or read from the memories 106a-106n through the busses 118a-118n.

Figure 2:
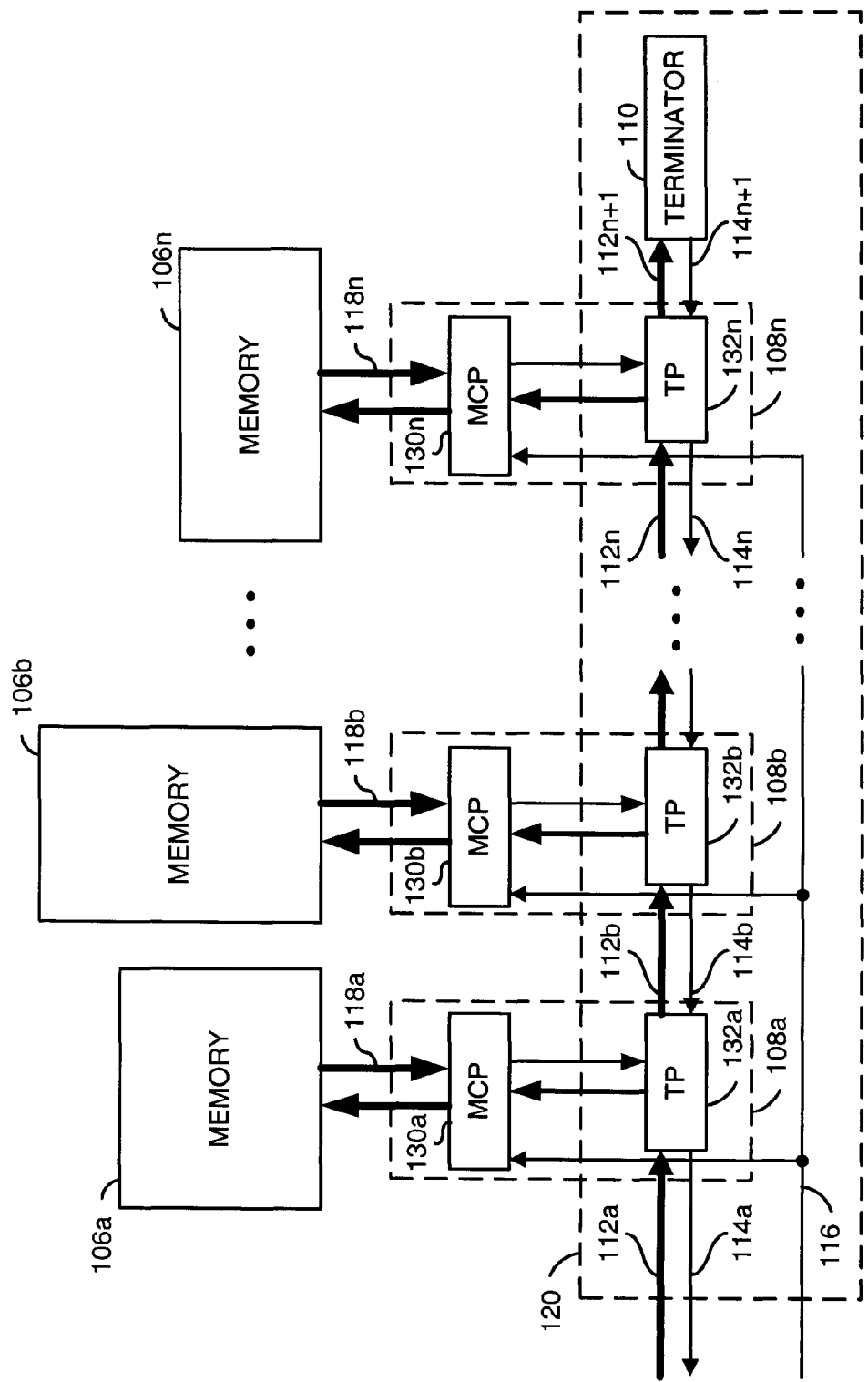
FIG. 2 is a block diagram illustrating a transport subsystem in accordance with a preferred embodiment of the present invention.

Referring to FIG. 2, a diagram is shown illustrating a transport subsystem 120 in accordance with the present invention. The transport subsystem 120 may be part of the MBIST chain architecture 100. In one example, each of the collars 108a-108n may comprise two relatively independent portions: blocks (or circuits) 130a-130n and blocks (or circuits) 132a-132n, respectively. The blocks 130a-130n may comprise memory-controlling portions (MCP). The blocks 132a-132n may comprise transport portions (TP). In one example, the blocks 130a-130n and the blocks 132a-132n may be implemented as finite state machines (FSMs). For example, the blocks 130a-130n and the blocks 132a-132n may include internal storage elements (e.g., flip-flops, registers, etc.).

The internal structure and interface of the memory-controlling portions 130a-130n may depend upon the particular memory (or memories) 106a-106n. Examples of memory-controlling circuits that may be used to implement the memory-controlling portions 130a-130n may be found in co-pending U.S. Patent Application Ser. Nos. 61/056,172 and 61/056,246, filed May 27, 2008, and Ser. No. 12/167,305, filed Jul. 3, 2008, which are herein incorporated by reference in their entirety. The internal structure and interface of the transport portions 132a-132n are generally similar and support a common signal protocol.

The transport subsystem 120 generally comprises the busses 112a-112n+1, the busses 114a-114n+1, the bus 116, the transport portions 132a-132n and the terminator circuit 110. The transport subsystem 120 generally performs two functions: (i) transmitting commands from the controller 104 to the individual collars 108a-108n and (ii) reading back data from the individual collars 108a-108n to the controller 104. The bus 116 may communicate a test/user mode selection signal to each of the memory-controlling portions 130a-130n. The busses 112a-112n may communicate commands and data from the controller 104 to the transport portions 132a-132n. The busses 114a-114n may communicate responses from the transport portions 132a-132n to the controller 104. The memory-controlling portions 130a-130n and the respective transport portions 132a-132n may communicate via a number of connections (or busses). The memory-controlling portions 130a-130n may communicate with the respective memory circuits 106a-106n via the busses 118a-118n.

Figure 3:
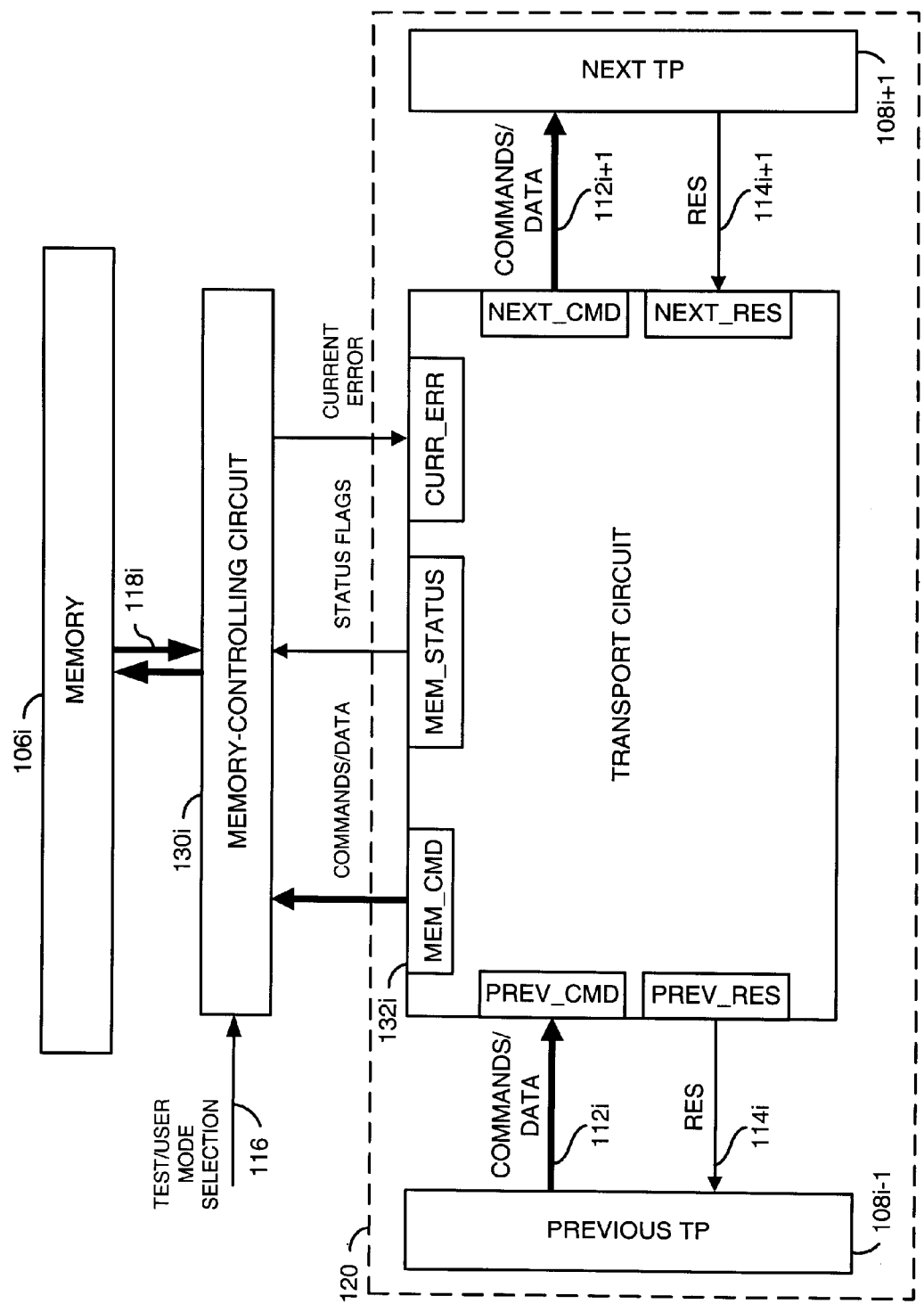
FIG. 3 is a block diagram illustrating various ports of a transport portion of FIG. 2.

Referring to FIG. 3, a diagram is shown illustrating an example of an interface (or set of ports) of a representative transport portion 132i of a representative collar 108i. In one example, each of the transport portions 132a-132n may include a number of ports that may be configured to connect each of the transport portions 132a-132n with neighboring transport portions and the respective memory-controlling portions 130a-130n. In one example, the transport portion 132i may comprise a number of input/output (I/O) ports. For example, the transport portion 132i may include an input port Prev_Cmd, an output port Prev_Res, an input port Next_Res, an output port Next_Cmd, an output port Mem_Cmd, an output port Mem_Status and an input port Curr_Err.

The input port Prev_Cmd may be configured to receive commands and/or data from a previous transport portion $132i-1$ via a bus $112i$. The output port Prev_Res may be configured to present responses (e.g., an error/flare signal) to the previous transport portion $132i-1$ via a single-bit bus or wire $114i$. The output port Next_Cmd may be configured to present commands and/or data to a next transport portion $132i+1$ via a bus $112i+1$. The input port Next_Res may be configured to receive responses (e.g., an error/flare signal) from the next transport portion $132i+1$ via a single-bit bus or wire $114i+1$. The output port Mem_Cmd may be configured to present memory access commands and/or data to the memory-controlling portion $130i$ via a first bus. The output port Mem_Status may be configured to present status information (e.g., STATUS FLAGS, etc.) to the memory-controlling portion $130i$ via a second bus. The second bus may be implemented, in one example, as a 2-bit bus. The input port Curr_Err may be configured to receive responses (e.g., a current error signal) from the memory-controlling portion $130i$ via a third bus. The third bus may be implemented, in one example, as a single-bit bus or wire.

The ports Prev_Cmd, Next_Cmd and Mem_Cmd generally have similar bit-widths (e.g., 8-10 bits). Commands transmitted through the ports Prev_Cmd, Next_Cmd and Mem_Cmd generally cover all of the operations, such as controlling the transport portion $132i$, manipulating the address registers in the memory-controlling portion $130i$ and operating the particular memory circuit $106i$ under test. In a particular implementation, commands of different classes may be distinguished by, in one example, one or more most significant bits (or prefixes) of a particular command. In one example, a set of commands relevant to the transport portion $132i$ may be implemented (e.g., a command NOP, a command RESET TP and a command SET TP). Another set of commands relevant to the memory-controlling portion $130i$ may be implemented also. The commands relevant to the memory-controlling portion $130i$ may pass through the transport portion $132i$ unchanged. In one example, the command SET TP may be defined to include two 1-bit parameters. For example, the command and parameters may be represented as SET TP FLAGS=00, SET TP FLAGS=01, SET TP FLAGS=10 and SET TP FLAGS=11. Such a definition may be treated as being four commands.

Figure 4:
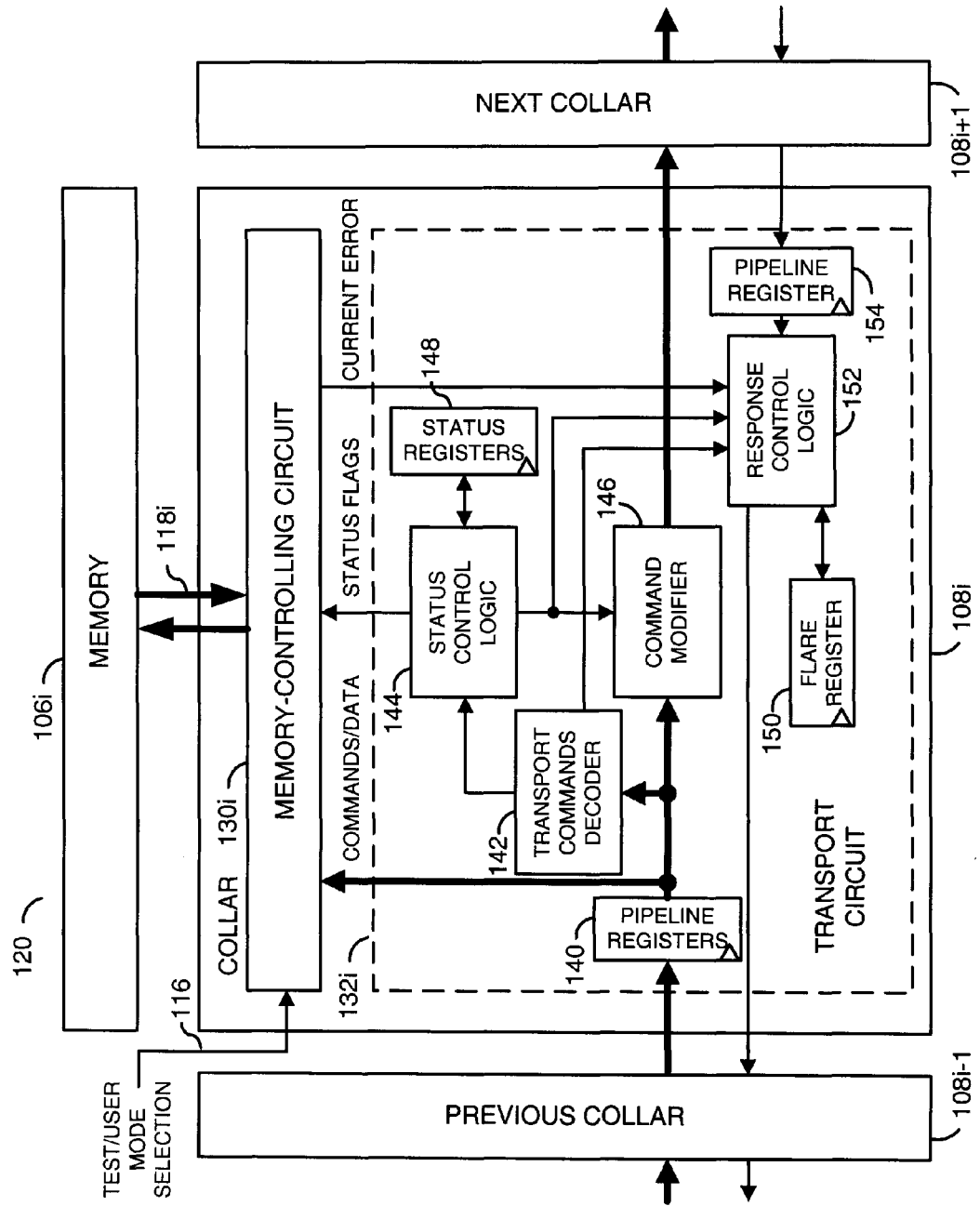
FIG. 4 is a block diagram illustrating an example of a transport portion of a collar implemented in accordance with a preferred embodiment of the present invention.

Referring to FIG. 4, a detailed diagram illustrating an example transport portion $132i$ in accordance with an embodiment of the present invention is shown. The transport circuit $132i$ generally comprises a block (or circuit) 140, a block (or circuit) 142, a block (or circuit) 144, a block (or circuit) 146, a block (or circuit) 148, a block (or circuit) 150, a block (or circuit) 152 and a block (or circuit) 154. The circuits 140, 148, 150 and 154 may be implemented as storage elements (e.g., flip-flops, registers, etc.). The block 142 may be implemented, in one example, as a transport command decoder. The block 144 may be implemented, in one example, as a status control logic. The block 146 may be implemented, in one example, as a command modifier. The block 152 may be implemented, in one example, as a response control logic.

The registers 140, 148, 152, and 154 generally hold a current state of the transport portion $132i$. The register 140 generally comprises a command register that may temporarily (e.g., for one clock cycle) hold commands received from the previous collar $108i-1$ (or the controller 104 when the collar $108i$ is the first collar in the chain). In one example, the register 148 may be implemented as three status registers, each containing a one-bit status variable (or flag). In one example, the status variables may be referred to as USED, ACTIVE and DIAG. The register 150 may be implemented, in one example, as a one-bit register. In one example, the register 150 may contain a value that may be referred to as FLARE. In one example, the value FLARE may accumulate an error status of the respective memory $106i$. The register 154 may be implemented, in one example, as a one-bit register that may temporarily (e.g., for one clock cycle) hold the response from the next collar $108i+1$ (or from the terminator circuit 110). The registers 140 and 154 from all the collars $108a$-$108n$ may be considered, in a broader view, as parts of two pipelines.

In one example, the transport portion $132i$ may provide the following elements of behavior:

(a) transmitting commands from the port Prev_Cmd to the port Next_Cmd, either unchanged or modified (referred to as "forward transportation");

(b) controlling the respective MCP $130i$;

(c) supporting different modes of operations for receiving/collecting responses from the MCP $130i$ and controlling the selection of the current mode;

(d) receiving/collecting responses from the MCP $130i$ and/or sending the responses combined with signals from the port Next_Res to the port Prev_Res (referred to as "backward transportation").

An example behavior of command transmitting (e.g., from the port Prev_Cmd to the port Next_Cmd) and related updating of flags (status registers 148) of the transport portion $132i$ may be summarized as in the following TABLE 1, where "*" represents a "don't care" value:

TABLE 1

| Prev_Cmd (delayed) | Old Status | New Status | Next_Cmd |
|---|---|---|---|
| NOP | *** | unchanged | NOP |
| RESET TP | *** | 0** | RESET TP |
| SET TP FLAGS = ab | 0** | 1ab | NOP |
|  | 1** | unchanged | SET TP FLAGS = ab |
| any other command | *** | unchanged | same as Prev_Cmd |

The register 150 may accumulate an error status of the particular memory $106i$ under test. When the command SET TP is received, the register 150 is generally reset to 0. Otherwise, the new value of the register 150 may be set equal to the old value ORed with the response (e.g., the signal CURRENT ERROR) received from the memory-controlling portion $130i$ at the port Curr_Err as follows:

$$\text{FLARE}(t+1) = \text{FLARE}(t) \vee \text{Curr\_Err}(t).$$

For example, when the value FLARE=1, the response from the memory $106i$ (e.g., the signal CURRENT ERROR received at the port Curr_Err) has not been constantly 0 during all the time after the last occurrence of the command SET TP.

Example behavior of the "backward transport logic" may be summarized as follows:

1. regular mode (e.g., status register USED=1): Prev_Res(t)=Curr_Err(t) ∨ Next_Res(t−1);

2. "get flare" mode (on RESET TP command): Prev_Res(t)=FLARE(t);

3. flare transfer mode (status register USED=0): Prev_Res(t)=Next_Res(t−1).

In addition to the registers of the transport circuit $132i$, the memory-controlling portion $130i$ may implement a set of registers (not shown) to maintain such information as:

1. general information related to the current part (phase) of the test (e.g., is the phase relevant to the memory 106$i$?, which input and output ports are in use during the phase?, etc.);

2. Flags describing the address sequence of the currently used test phase (e.g., for march tests, forward/backward, fast X/fast Y, etc.);

3. the current address;

4. a mask selecting outputs to be observed (e.g., if DIAG=0, observe and check for the correctness all bits of the current output port; otherwise only one of them);

5. data encoding scheme (e.g., multi-bit values on data in/data out ports of memory may be packed to 1-bit or 2-bit codes, and the encoding may be different during different phases of the test);

6. etc.

In general, the registers of the memory controlling portion 130$i$ need to be properly set. Some of the registers may be directly associated with particular commands (e.g., "set (some flag)=value"). Others, like an address register, may be (re)set and modified in a more complicated process. For example, a command "start a new phase" may result in setting the registers describing the phase as well as resetting the address register. During the phase, the address register may be controlled in an incremental way. For example, a typical command such as "read from (write to) the current location and go to next (previous) one" may be implemented.

On the output side of the memory-controlling portion 130$i$, values from output ports may be converted into a 1-bit signal (e.g., CURRENT ERROR). The transformation may include the selection of the output port (and its particular bit, if necessary) and a comparison of the output port with an expected value (also provided in the packed form). The result may be masked out, for example, if (i) the memory is not in use (e.g., USED=0), (ii) the port is currently disabled, or (iii) the current address is out-of-range for the particular memory. The result may be masked out in some other cases as well.

Figure 5:
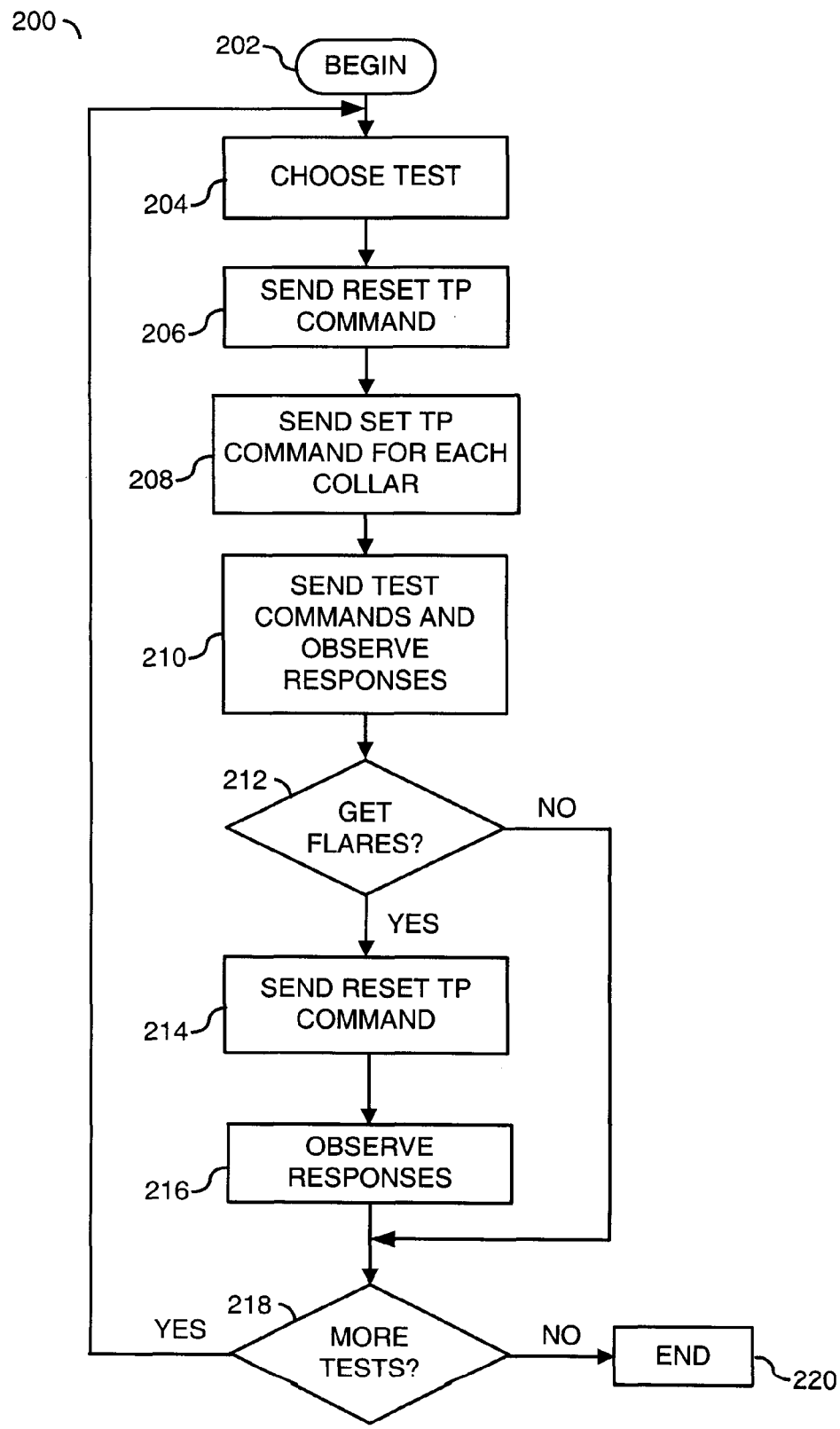
FIG. 5 is a flow diagram of a process in accordance with the present invention.

Referring to FIG. 5, a flow diagram is shown illustrating a process 200 in accordance with an embodiment of the present invention. The process 200 generally illustrates an example test protocol utilizing the transport subsystem 120 and the transport portions (TP) 132$a$-132$n$. In one example, the process 200 may comprises a step 202, a step 204, a step 206, a step 208, a step 210, a step 212, a step 214, a step 216, a step 218, and a step 220. The step 202 may comprise a start step. The step 204 may comprise a test selection step. The step 206 may comprise a reset step. The step 208 may comprise a transport portion set-up (e.g., flag setting) step. The step 210 may comprise a testing step. The step 212 may determine whether error status information is to be queried. The step 214 may comprise a reset step. The step 216 may comprise an observation step. The step 218 may determine whether further testing is to be performed. The step 220 may comprise an end state.

The process 200 generally begins in the step 202 and moves to the step 204. In the step 204, a test is selected. When the test has been selected, the process 200 moves to the step 206. In the step 206, a single RESET TP command may be sent to the collars 108$a$-108$n$. When the reset command has been sent, the process 200 moves to the step 208. In the step 208, status flags of all of the collars 108$a$-108$n$ may be set by sending appropriate SET TP commands. In one example, the SET TP commands may be sent as a contiguous block. In another example, the SET TP commands may be sent separated in any manner by NOPs. The first SET TP command generally refers to the collar nearest to the controller 104 (e.g., the collar 108$a$), the second SET TP command generally refers to the next collar 108$b$, and so forth. In general, any subset of the memory circuits 106$a$-106$n$ may be activated via the appropriate SET TP commands to apply appropriate tests.

When the SET TP commands have been sent, the process 200 may move to the step 210. In the step 210, the process 200 sends testing commands to the collars 108$a$-108$n$ and observes responses. In general, any sequence of testing commands (e.g., sequences not containing the RESET TP and/or the SET TP commands) may be sent. During testing, an expected output value of the memory circuits 106$a$-106$n$ may be presented to the appropriate collar 108$a$-108$n$ for comparison with the actual output of the respective memory. For example, a response value (e.g., RES=1) received by the controller 104 may indicate that some error occurred on one of the active memory circuits 106$a$-106$n$ (e.g., those where USED=1). The expected output values sent to the collars 108$a$-108$n$ may comprise actual expected values or hints (e.g., compressed or reduced values) that may be used by the collars 108$a$-108$n$ to generate actual expected values for comparison with the actual outputs of the respective memory. Alternately, zeroes may be sent as expected values. If only one of the memory circuits 106$a$-106$n$ has been selected as active, and only one output bit is not masked out, then the sequence of values RES will directly reflect values on the pins of the selected one of the memory circuits 106$a$-106$n$.

When the testing is completed, the process 200 may move to the step 212. In the step 212, the process 200 determines, in one example, whether the values of the registers 150 of the transport portions 132$a$-132$n$ are to be obtained. In one example the values of the registers 150 may be used to indicate which of the memory circuits 106$a$-106$n$ failed during testing. When the flare values are not desired, the process 200 may move to the step 218. When the flare values are to be obtained, the process 200 may move to the step 214.

In the step 214, the process 200 may send the RESET TP command to the collars 108$a$-108$n$ to initialize the process of obtaining the flare values. When the RESET TP command has been sent, the process 200 may move to the step 216. In the step 216, the process 200 generally observes the signal RES from the collars 108$a$-108$n$ to determine the flare values. In one example, each second value of the signal RES may contain one of the flare values (e.g., starting with the collar 108$a$-108$n$ nearest to controller 104).

When the flare values have been obtained, the process 200 may move to the step 218. In the step 218, the process 200 determines, in one example, whether further tests are to be performed. If further testing is to be performed, the process 200 returns to the step 204. When testing is complete, the process 200 moves to the step 220 and terminates.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

As would be apparent to those skilled in the relevant art(s), the signals illustrated in FIGS. 1-4 represent logical data flows. The logical data flows are generally representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s).

The function performed by the flow diagram of FIG. 5 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

Embodiments of the present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a controller configured to (i) present one or more commands and (ii) receive one or more responses;
   a plurality of transport circuits each configured to (i) receive said one or more commands, (ii) present said one or more responses, and (iii) generate one or more control signals, wherein said plurality of transport circuits are connected to form a pipeline chain with said controller connected to an end of the chain and each of said plurality of transport circuits are further configured to respond to a relevant one of said one or more commands, pass non-relevant ones of said one or more commands to another transport circuit, and pass said one or more responses along the chain to said controller; and
   a plurality of memory-controlling circuits, each of said plurality of memory-controlling circuits coupled to a respective one of the plurality of transport circuits and configured to (i) generate one or more memory access signals in response to said one or more control signals, (ii) receive one or more memory output signals from a respective memory in response to said one or more memory access signals, and (iii) generate a respective one of said one or more responses in response to said one or more memory output signals;
   wherein (i) each respective memory is independently sized and (ii) said controller provides a common testing routine for each respective memory that is adjusted for the size of each respective memory by said memory-controlling circuits.

2. The apparatus according to claim 1, wherein said controller comprises a testing controller.

3. The apparatus according to claim 2, wherein said testing controller comprises a built-in self test (BIST) controller.

4. The apparatus according to claim 3, wherein said apparatus is part of a memory built-in self-test (MBIST) chain architecture.

5. The apparatus according to claim 1, wherein each respective memory has a different size.

6. The apparatus according to claim 5, wherein a first group of respective memories has a first size and a second group of respective memories has a second size, wherein said first and second sizes are different.

7. The apparatus according to claim 1, wherein each of said transport circuits comprises a finite state machine.

8. The apparatus according to claim 1, wherein each of said transport circuits comprises:
   a transport command decoder configured to receive said commands;
   a status control logic coupled to said transport command decoder and configured to generate one or more status signals;
   a command modifier coupled to said status control logic, configured to receive said commands and further configured to present an output in response to said commands and a signal from said status control logic; and
   a response control logic configured to generate said responses based upon said response from the respective memory-controlling circuit, said signal from said status control logic, a signal from said transport command decoder, a value stored in a register and a signal received from another transport circuit.

9. The apparatus according to claim 8, wherein said value stored in said register indicates an error status of the respective memory coupled to the respective memory-controlling circuit.

10. An apparatus comprising:
    means for controlling a memory test, said memory test controlling means configured to (i) present one or more commands and (ii) receive one or more responses;
    means for transporting commands and responses to a plurality of memories, said transporting means configured to (i) receive said one or more commands, (ii) present said one or more responses, and (iii) generate one or more control signals, wherein said transporting means comprises transport circuits connected to form a pipeline chain with said memory test controlling means connected to an end of the chain and each of said transport circuits responds to a relevant one of said one or more commands, passes non-relevant ones of said one or more commands to another transport circuit, and passes said one or more responses along the chain to said memory test controlling means; and
    means for controlling said plurality of memories, said memory controlling means coupled to said transporting means and configured to (i) generate one or more memory access signals in response to said one or more control signals, (ii) receive one or more memory output signals from said plurality of memories in response to said one or more memory access signals, and (iii) generate said responses in response to said one or more memory output signals;
    wherein (i) each of said plurality of memories is independently sized and (ii) said memory test controlling means provides a common testing routine for said plurality of memories that is adjusted for the size of each of said plurality of memories by said memory controlling means.

11. A method of transporting information in a memory built-in self test (MBIST) chain architecture comprising:
    generating a reset command, one or more initialization commands, and a sequence of test commands;
    resetting one or more transport circuits in response to said reset command, wherein said transport circuits are connected to form a pipeline chain with a controller connected to an end of the chain, said commands are passed along the chain from said controller, and one or more responses are passed along the chain to said controller;
    initializing said one or more transport circuits in response to said one or more initialization commands; and generating said one or more response in response to testing one or more memories coupled to said one or more transport circuits based upon said sequence of test commands.

12. The method according to claim 11, further comprising:
generating a second reset command; and
transporting an error status of each of said one or more memories to said controller in response to said second reset command.

13. The method according to claim 11, wherein each of said one or more transport circuits responds to a relevant one of said one or more initialization commands and passes non-relevant ones of said one or more initialization commands to another transport circuit.

14. The method according to claim 11, further comprising generating one or more status signals in response to said one or more initialization commands.

15. The method according to claim 11, further comprising generating one or more memory access signals in response to said sequence of test commands.

16. The method according to claim 15, wherein said one or more memory access signals comprise signals configured according to characteristics of each of said one or more memories.

17. The method according to claim 11, further comprising:
selecting one or more tests to be performed on one or more memories coupled to said MBIST chain architecture.

18. The method according to claim 17, further comprising:
determining whether any test remain to be performed; and
when one or more tests remain to be performed, beginning the next test.

19. The method according to claim 11, further comprising:
transporting expected output values generated by said controller for testing said one or more memories along said chain.

20. The method according to claim 11, further comprising accumulating an error status for said one or more memories.

* * * * *